(12) United States Patent
Siciliani et al.

(10) Patent No.: US 10,922,220 B2
(45) Date of Patent: Feb. 16, 2021

(54) READ AND PROGRAM OPERATIONS IN A MEMORY DEVICE

(71) Applicant: Intel Corporation, Santa Clara, CA (US)

(72) Inventors: Umberto Siciliani, Rubano (IT); Giulio Giuseppe Marotta, Contigliano (IT); Tommaso Vali, Marine (IT); Luca De Santis, Avezzano (IT); Agostino Macerola, San Benedetto dei Marsi (IT); Violante Moshciano, Bacoli (IT); Luigi Pilolli, L'Aquila (IT); Giovanni Santin, Rieti (IT); Michele Incarnati, Avezzano (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/640,522

(22) Filed: Jul. 1, 2017

(65) Prior Publication Data
US 2019/0004938 A1 Jan. 3, 2019

(51) Int. Cl.
*G06F 12/02* (2006.01)
*G06F 12/0802* (2016.01)
(Continued)

(52) U.S. Cl.
CPC ...... *G06F 12/0238* (2013.01); *G06F 12/0246* (2013.01); *G06F 12/04* (2013.01); *G06F 12/0802* (2013.01); *G06F 12/1009* (2013.01); *G11C 11/5628* (2013.01); *G11C 11/5642* (2013.01); *G11C 16/06* (2013.01); *G11C 16/10* (2013.01); *G11C 16/26* (2013.01); *G06F 2212/1024* (2013.01); *G06F 2212/7201* (2013.01); *G06F 2212/7202* (2013.01);
(Continued)

(58) Field of Classification Search
CPC .. G06F 12/0238; G06F 12/1009; G06F 12/04; G06F 12/0802; G11C 11/5628; G11C 16/06
USPC .......................................................... 711/154
See application file for complete search history.

(56) References Cited

U.S. PATENT DOCUMENTS

| | | |
|---|---|---|
| 2007/0263438 A1 | 11/2007 | Chen |
| 2012/0198135 A1 | 8/2012 | Chilappagari et al. |
| 2017/0199703 A1* | 7/2017 | Ravimohan ......... G06F 12/0607 |

FOREIGN PATENT DOCUMENTS

WO WO 2014/066829 A1 5/2014

OTHER PUBLICATIONS

Extended European Search Report dated Nov. 22, 2018, in EP Application No. 18180942.7, filed Jun. 29, 2018; 8 pages.
(Continued)

*Primary Examiner* — Hua J Song
(74) *Attorney, Agent, or Firm* — Alliance IP, LLC

(57) ABSTRACT

Technology for a memory device operable to program memory cells in the memory device is described. The memory device can include a plurality of memory cells and a memory controller. The memory controller can receive a page of data. The memory controller can segment the page of data into a group of data segments. The memory controller can program the group of data segments to memory cells in the plurality of memory cells that are associated with an inhibit tile group (ITG). The group of data segments for the page of data can be programmed using all bits included in each of the memory cells associated with the ITG.

28 Claims, 12 Drawing Sheets

(51) Int. Cl.
*G06F 12/04* (2006.01)
*G06F 12/1009* (2016.01)
*G11C 16/06* (2006.01)
*G11C 11/56* (2006.01)
*G11C 16/26* (2006.01)
*G11C 16/10* (2006.01)

(52) U.S. Cl.
CPC ............... *G06F 2212/7203* (2013.01); *G11C 2211/5641* (2013.01)

(56) References Cited

OTHER PUBLICATIONS

EPO; Office Action issued in European Patent Application No. EP 18180942.7, dated Apr. 30, 2020; 7 pages.

\* cited by examiner

READ AND PROGRAM OPERATIONS IN A MEMORY DEVICE

BACKGROUND

Memory devices are typically provided as internal, semiconductor, integrated circuits in computers or other electronic devices. There are many different types of memory including volatile memory, for example, dynamic random access memory (DRAM) and synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein.

Figure 1A:
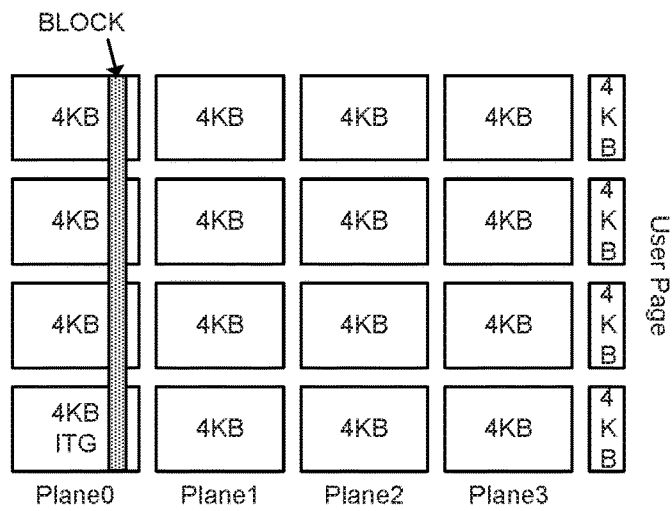
FIGS. 1A and 1B illustrate storing a page of data in memory cells of a memory device in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of particles would either completely lack particles, or so nearly completely lack particles that the effect would be the same as if it completely lacked particles. In other words, a composition that is" substantially free of an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In one example, memory devices can utilize non-volatile memory. Non-volatile memory is a storage medium that does not require power to maintain the state of data stored by the medium. Non-limiting examples of non-volatile memory can include any or a combination of solid state memory (such as planar or three-dimensional (3D) NAND flash memory, NOR flash memory, or the like), cross point array memory, including 3D cross point memory, phase change memory (PCM), such as chalcogenide PCM, non-volatile dual in-line memory module (NVDIMM), byte addressable nonvolatile memory, ferroelectric memory (Fe-RAM), silicon-oxide-nitride-oxide-silicon (SONOS) memory, polymer memory (e.g., ferroelectric polymer memory), ferroelectric transistor random access memory (Fe-TRAM), spin transfer torque (STT) memory, nanowire memory, electrically erasable programmable read-only memory (EEPROM), magnetic storage memory, magnetoresistive random-access memory (MRAM), write in place non-volatile MRAM (NVMRAM), nanotube RAM (NRAM), and the like. In some examples, non-volatile memory can comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In one specific example, the memory device 100 can utilize 3D cross point memory. In another specific example, the system memory can be STT memory.

In one example, the memory device can be a NAND flash memory device that includes a plurality of memory cells. The memory cells can be single-level cells (SLC) with 1 bit per cell. The memory cells can be multi-level cells (MLC) with 2 bits per cell. The memory cells can be tri-level cells (TLC) with 3 bits per cell. Alternatively, the memory cells can be quad-level cells (QLC) with 4 bits per cell.

In one example, the memory device can include a plurality of memory cells that each adhere to a floating gate transistor design. For example, in a given memory cell, electricity can flow through a transistor, and the transistor can be connected to a source, a drain and a floating gate. The electricity can flow from the source to the drain with the aid of the floating gate. For example, the electricity can flow when the floating gate is shut, but does not flow when the floating gate is open. The state of the floating gate can be changed by a specific process and can continue to stay in that state, i.e., is non-volatile, until the floating gate is changed by another specific process (and then stays in that re-changed state as well). The transistor can have a second gate above the floating gate, which is referred to as a control gate. A gate oxide layer can be between the control gate and the floating gate, and a tunnel oxide layer can be between the floating gate and the source and the drain. When the floating gate is shut, electricity can pass between the source and the drain, and this charged state can register a binary value of 0. When the floating gate is open, electricity does not pass between the source and the drain, and this uncharged state can register a binary value of 1. In other words, the memory cell can be programmed with the binary value of 0 or the binary value of 1 depending on whether electricity can or cannot flow between the source and the drain.

In one example, the memory device can include a plurality of memory cells. The memory cells can be an array of columns and rows. The columns of memory cells can be referred to as bitlines and the rows of memory cells can be referred to as wordlines. In one example, for a given memory cell, when a relatively high voltage (e.g., 18 volts) is applied to the control gate through the wordline, and a lower, ground voltage is applied to the drain through the bitline, then a strong electronic field can be set up. The floating gate is thus charged (i.e., the floating gate is now closed) as electricity cannot flow from the source to the drain, and the memory cell registers the binary value of 0. This memory cell can have a certain threshold voltage, for example, 1 volt or higher. To reverse this process, a relatively high voltage (e.g., 20 volts) can be applied to the drain through the bitline and a lower, ground voltage can be applied to the control gate through the wordline, and a strong reverse electronic field can be set up. The floating gate is now open as electricity can flow from the source to the drain, and the memory cell registers the binary value of 1. This memory cell now has a certain threshold voltage, for example, −3 volts or lower.

In one example, reading the memory cell can involve measuring a flow of electricity between the source and the drain. The voltage threshold above which current will flow between the source and the drain can vary with the state of the floating gate. A reference or read-point voltage can be applied across the source and the drain, and the current can be tested. If the current is at a certain level, this indicates the binary value of 1, and if the current is not at the certain level, this indicates the binary value of 0. In other words, the current can be measured to determine whether or not there is a current flow state.

For SLC, the binary values are 0 or 1, which indicates 2 states and thus one threshold voltage. For MLC, the binary values are 00, 10, 01 or 11, which indicates 4 states and thus 3 threshold voltages. For TLC, the binary values are 000, 001, 010, 011, 100, 101, 110 or 111, which indicates 8 states and thus 7 threshold voltages. For QLC, the binary values are 0000, 0001, 0010, 0011, 0100, 0110, 0111, 1000, 1001, 1010, 1011, 1100, 1101, 1110 or 1111, which indicates 16 states and 15 threshold voltages. Each binary value can have a different threshold voltage. For example, a lowest binary value can have a highest threshold voltage, a highest binary value can have a lowest threshold voltage, and intermediate binary values can have progressively different threshold voltages. In one example, for QLC, the binary value of 0000 has the highest threshold voltage, the binary value of 0001 has a lower threshold voltage, the binary value of 0010 has a next lower threshold voltage, and so on until the binary value of 1111, which has the lowest threshold voltage.

In one example, the threshold voltage can be set when the memory cell is programming. For read operations, threshold voltage tests between groups of states can be applied successively with different threshold voltages being used. For example, with MLC, a first threshold voltage test can indicate that a memory cell's binary value is either (00 or 01) or (10 or 11), and an additional test with a revised threshold voltage can be performed to determine the specific binary value. For TLC, a first threshold voltage test can obtain 4 possible binary values, a second threshold voltage test can further obtain 2 possible binary values, and a third threshold voltage test can reveal the actual binary value. For QLC, a first threshold voltage test can obtain 16 possible binary values, a second threshold voltage test can further obtain 8 possible binary values, a third threshold voltage test can obtain 4 possible binary values, a fourth threshold voltage test can obtain 2 possible binary values, and a fifth threshold voltage test can reveal the actual binary value. Therefore, reading memory cells configured with QLC can take a longer period of time as compared to reading memory cells configured with TLC, MLC or SLC. Similarly, programming and erasing memory cells configured with QLC can take a longer period of time as compared to programming and erasing memory cells configured with TLC, MLC or SLC. In addition, an overall voltage range used in NAND cell operations have not been adjusted when progressing from SLC to MLC to SLC and QLC, so the precision of the reference voltage setting and the resulting current measurement has become more refined in response to increases in the cell bit contents.

In one example, the read operation for the memory cell can be performed by applying a voltage ramp to the control gate of the memory cell to establish a level at which the programmed memory cell enters a conduction state. The voltage ramp can be generated on a wordline in an array of memory cells to read memory cells associated with the wordline.

In one example, NAND flash memory cells can include a floating gate, a control gate, a drain and a source. The memory cell can be set (or programmed) and reset (or erased) by applying or removing charge from the floating gate. The charge can be applied or removed from the floating gate of the memory cell via Fowler-Nordheim (FN) current tunneling or via Hot Carrier Injection (HCI). The FN tunneling and HCI are useful for programming and erasing flash memory, but also cause the flash memory cells to have a limited lifetime. When the charge is applied to or removed from the floating gate, the threshold voltage (VT) of the underlying transistor changes, thereby allowing the flash memory cell to be used as a memory storage device. In addition, after the charge is injected into or removed from the floating gate, the floating gate remains in that state even after power is removed, such that the flash memory cell is non-volatile.

FIG. 1A illustrates an exemplary technique for storing a page of data into memory cells of a memory device. The memory device can include a plurality of planes of memory cells (e.g., Plane0, Plane1, Plane2 and Plane 3), and the memory cells can support QLC. Each plane can include a plurality of inhibit tile groups (ITGs). Each ITG can comprise a plurality of memory cells. In this specific example, each plane can include 4 ITGs, and each ITG can have a storage capacity of 4 kilobytes (KB). In one example, the page of data (16 KB) can be allocated by spreading bits of the page of data across multiple ITGs (e.g., 4 ITGs). The page of data can be allocated into one wordline using only one bit of each memory cell (even though memory cells that support QLC can store 4 bits per cell). In this example, a block size for storing the page of data across the multiple ITGs can be represented as 1.

Figure 1B:
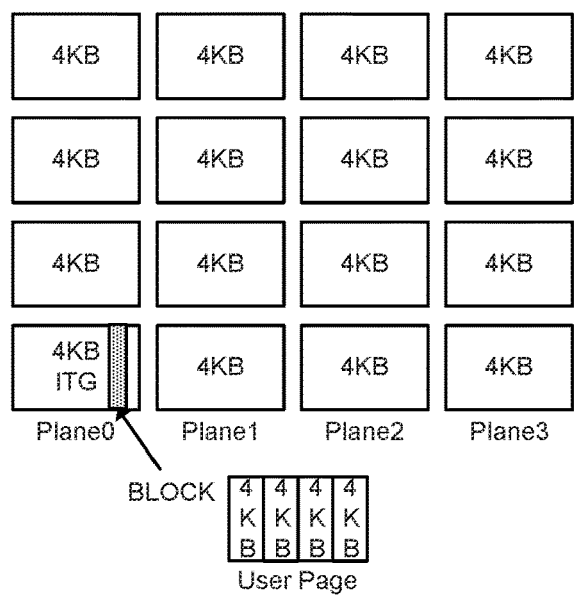

FIG. 1B illustrates an exemplary technique for storing a page of data into memory cells of a memory device. The memory device can include a plurality of planes of memory cells (e.g., Plane0, Plane1, Plane2 and Plane 3), and the memory cells can support QLC. Each plane can include a plurality of inhibit tile groups (ITGs). In this specific example, each plane can include 4 ITGs, and each ITG can have a storage capacity of 4 kilobytes (KB). In one example, the page of data (16 KB) can be allocated by storing bits of the page of data to a single ITG. The page of data can be allocated into one wordline using all four bits of each memory cell. This scheme can utilize compression by input/output (I/O) to use all of the bits of each memory cell in the single ITG. The 4 KB capacity of the ITG and the 4 bits per cell can allow for a page size of 16 KB. In this example, a block size for storing the page of data in the single ITG can be represented as ¼ as a block size for storing the page of data across multiple ITGs (as shown in FIG. 1A) can be represented as 1. By storing the page in the single ITG (as opposed to multiple ITGs) and having a reduced block size of ¼, a reduced number of tiles can be engaged during read and program operations, which can deliver improved performance during read and program operations. For example, the improved performances for program operations can be due to faster verify operations that are achievable with the reduced block size.

In one example, in FIG. 1A, same bits in different pages of data can be stored into the same memory cell, which leads to the increased number of ITGs used to store the page of data. In other words, bits of the same page of data can be spread among multiple memory cells. On the other hand, in FIG. 1B, a compression by I/O concept is shown in which bits of the same page of data can be stored into the same memory cell, thereby resulting in the decreased number of ITGs used to store the page of data. The decreased number of ITGs can result in the reduced number of tiles being engaged during read and program operations, which can improve performance for the read and program operations.

Figure 2A:
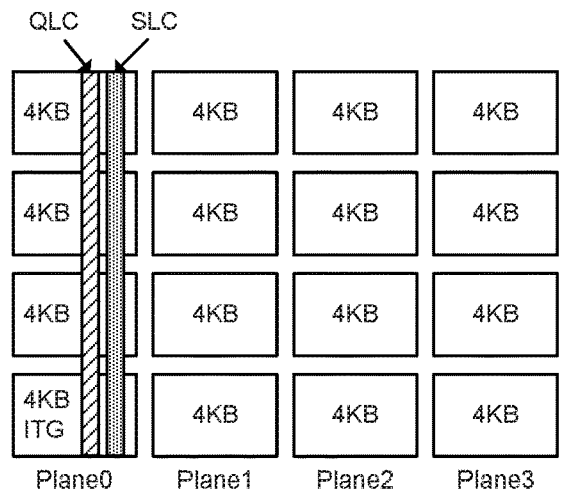
FIGS. 2A and 2B illustrate storing a page of data in memory cells of a memory device in accordance with an example embodiment.

FIG. 2A illustrates an exemplary technique for storing a page of data into memory cells of a memory device. The memory device can include a plurality of planes of memory cells (e.g., Plane0, Plane1, Plane2 and Plane 3), and the memory cells can support QLC and SLC. Each plane can include a plurality of inhibit tile groups (ITGs). In this specific example, each plane can include 4 ITGs, and each ITG can have a storage capacity of 4 kilobytes (KB). In one example, the page of data (16 KB) can be allocated by storing bits of the page of data to multiple ITGs (e.g., 4 ITGs) using QLC or SLC. In this example, the page of data can be allocated into one wordline using all possible bits of each memory cell (e.g., 1 bit for SLC or 4 bits for QLC). This scheme can store the page of data by utilizing compression by input/output (I/O) to use all of the possible bits of each memory cell in the multiple ITGs. In other words, in this scheme, bits of the same page of data can be stored into the same memory cell.

Figure 2B:
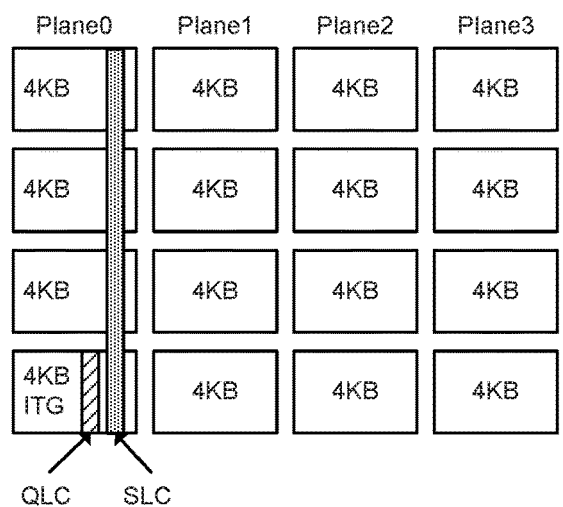

FIG. 2B illustrates an exemplary technique for storing a page of data into memory cells of a memory device. The memory device can include a plurality of planes of memory cells (e.g., Plane0, Plane1, Plane2 and Plane 3), and the memory cells can support QLC and SLC. Each plane can include a plurality of inhibit tile groups (ITGs). In this specific example, each plane can include 4 ITGs, and each ITG can have a storage capacity of 4 kilobytes (KB). In one example, the page of data (16 KB) can be allocated by storing bits of the page of data to multiple ITGs (e.g., 4 ITGs) using SLC, or the page of data (16 KB) can be allocated by storing bits of the page of data to a single ITG using QLC. In this example, the page of data can be allocated into one wordline using all possible bits of each memory cell (e.g., 1 bit for SLC or 4 bits for QLC). This scheme can store the page of data by utilizing compression by input/output (I/O) to use all of the possible bits of each memory cell in the multiple ITGs. In other words, in this scheme, bits of the same page of data can be stored into the same memory cell.

In one example, read and verify operations can be achieved using wordline ramp sensing. Wordline ramp sensing can be more effective but more complex as compared to wordline step sensing. With ramp sensing, a wordline of a memory array can be ramped up linearly and a sensing operation can be performed while the wordline is continuously being ramped up. In this case, during the sensing operation, a bit line of the memory array can be sensed while the wordline is ramping up and then a result (based on a sensed level) can be transferred into a data latch. In conventional wordline step sensing, a bit line of the memory array can be first precharged to a particular voltage level (e.g., a read voltage level) and then sensed while the word line is held at the particular voltage level. In this case, the word line can first settle at the particular voltage level prior to the sensing operation and then the sensing operation can be performed while the word line remains at the particular voltage level.

In one configuration, an increased ramp rate for wordline ramp sensing is desirable in an architecture that supports a compression by I/O (i.e., in which bits of the same page of data can be stored into the same memory cell, thereby resulting in the decreased number of ITGs used to store the page of data). More specifically, the increased ramp rate can be achieved by utilizing a wordline ramp read with two separate wordline ramp reads. For example, data can be read from memory cells using a first wordline ramp read and a second wordline ramp read. The first wordline ramp read can utilize shielded bitline even sensing for reading the certain data segments and the second wordline ramp read can utilize shielded bitline odd sensing for reading certain data segments. Alternatively, the first wordline ramp read can utilize shielded bitline odd sensing for reading certain data segments and the second wordline ramp read can utilize shielded bitline even sensing for reading certain data segments. The two separate wordline ramp reads (e.g., shielded bitline odd and even sensing) can be utilized with an architecture that supports the compression by I/O data allocation scheme. The usage of the two separate wordline ramp reads can improve a system performance. When pages are compressed by I/O, a page can be allocated into one wordline using all bits included in each of the memory cells associated with an ITG. In other words, the memory cells do not include bits from different pages of data. Rather, bits of a same page of data are programmed into a same memory cell.

In one example, a wordline ramp read can be performed using a counter that generates digital 8 bit value, which can raise from 0 to 256. Each of these values can be 1 out of a possible 256 values between a minimum cell voltage (Vt) and a maximum cell Vt in a range to be detected. As an example, for a minimum Vt=1 and a maximum Vt=6, there is a digital representation of the Vt at a step of ~27 mV. This value can be converted using a digital-to-analog converter (DAC) in a −1.6V range and sent to the wordline. In parallel, this value can be run across the eight lathes of a page buffer. When the cell is turned on from a wordline value, the corresponding digital value running on top of the page buffer can be stored into a corresponding latch. Depending on a wordline resynchronization circuit, a set of initial values on an entire range and a set of final values can now be used in this conversion, such that any non-linearity on the wordline may not be used. At each of the 256 steps, a sensing phase can be performed inside the page buffer. However, this approach for ramped sensing does not work with all bitline (ABL) sensing, in which all bit lines are sensed simultaneously. Therefore, a shielded bitline (SBL) approach can be adopted, in which even bitlines can be grounded when odd bitlines are being sensed, or odd bitlines can be grounded when even bitlines are being sensed.

Figure 3:
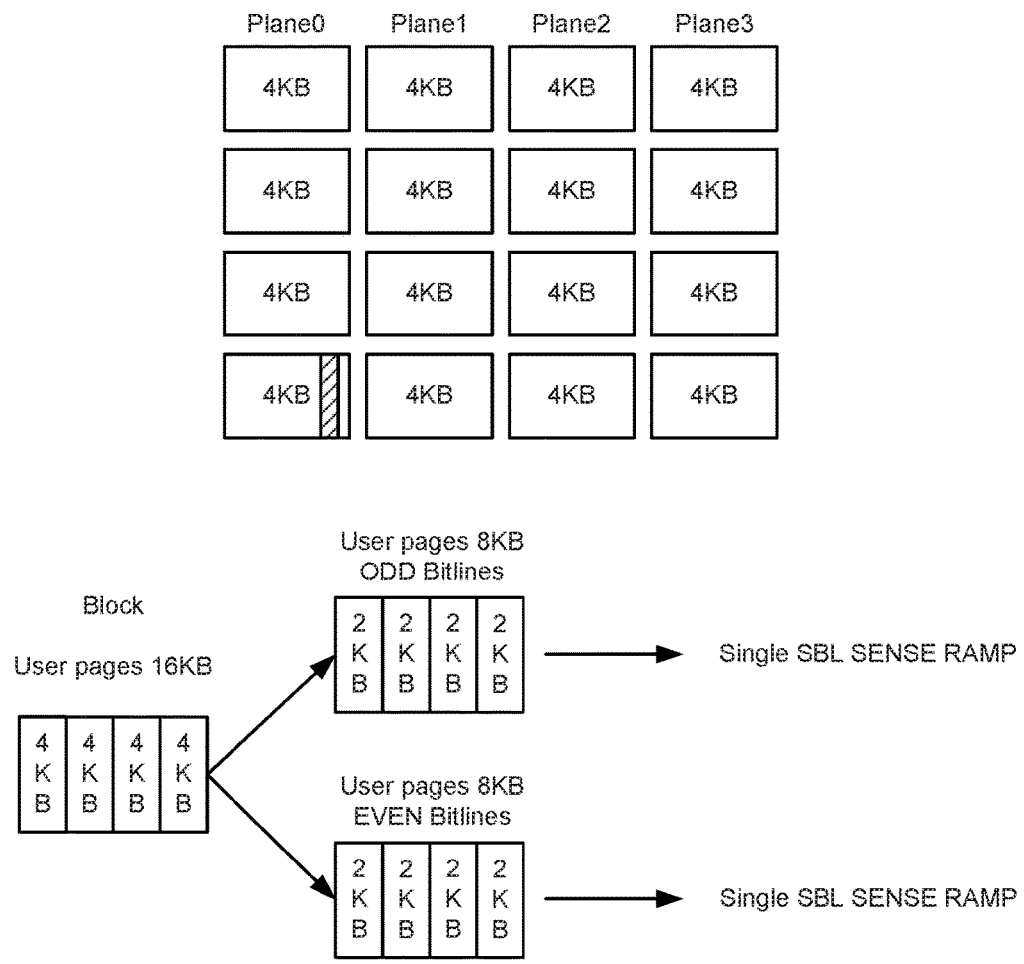
FIG. 3 illustrates a snap read operation in a memory device in accordance with an example embodiment.

FIG. 3 illustrates an exemplary snap read operation in a memory device. The memory device can include a plurality of planes of memory cells (e.g., Plane0, Plane1, Plane2 and Plane 3), and the memory cells can support QLC. Each plane can include a plurality of inhibit tile groups (ITGs). In this specific example, each plane can include 4 ITGs, and each ITG can have a storage capacity of 4 kilobytes (KB). A page of data (16 KB) can be allocated by storing bits of the page of data to a single ITG using QLC. In this example, the page of data can be allocated into one wordline using all possible bits of each memory cell (e.g., 4 bits for QLC). This scheme can store the page of data by utilizing compression by input/output (I/O) to use all of the possible bits of each memory cell in the single ITG. In other words, in this scheme, bits of the same page of data can be stored into the same memory cell.

In one example, the snap read operation can involve reading 8 KB of data in the 16 KB page of data in a relatively fast manner. The snap read operation can be achieved using one of two separate wordline ramp reads. For example, a first wordline ramp read can be used to read 8 KB of the 16 KB page of data, or a second wordline ramp read can be used to read the other 8 KB of the 16 KB page of data. In this example, the first wordline ramp read can utilize shielded bitline odd sensing, and the second wordline ramp read can utilize shielded bitline even sensing. In this case, snap read can be achieved by allocated 8 KB on odd bitlines and 8 KB on even bitlines. As a result, a relatively fast snap read operation can be achieved for reading the 8 KB of data in the 16 KB page of data.

Figure 4A:
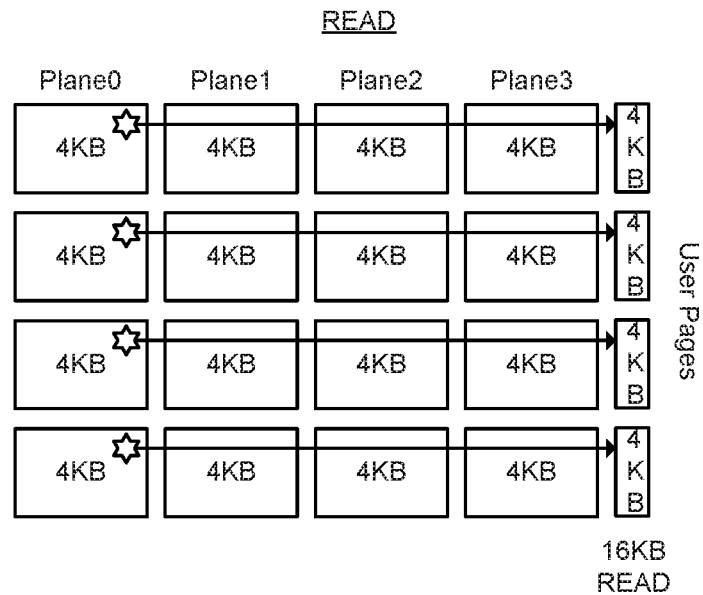
FIGS. 4A and 4B illustrate read and program operations in a memory device in accordance with an example embodiment.

FIG. 4A illustrates an exemplary technique for reading a page of data from memory cells of a memory device. The memory device can include a plurality of planes of memory cells (e.g., Plane0, Plane1, Plane2 and Plane 3), and the memory cells can support QLC. Each plane can include a plurality of inhibit tile groups (ITGs). In this specific example, each plane can include 4 ITGs, and each ITG can have a storage capacity of 4 kilobytes (KB). In one example, the page of data (16 KB) may have been previously allocated by spreading bits of the page of data across multiple ITGs (e.g., 4 ITGs), so the page of data can be read by extracting the bits of the page of data across the multiple ITGs (e.g., 4 ITGs). For example, the page of data may have been previously allocated into one wordline using only one bit of each memory cell (even though memory cells that support QLC can store 4 bits per cell), so the page of data can be read by extracting one bit of the page of data from each of the memory cells in the multiple ITGs. By extracting the one bit of the page of data from each of the memory cells in the multiple ITGs, the 16 KB page of data can be read.

Figure 4B:
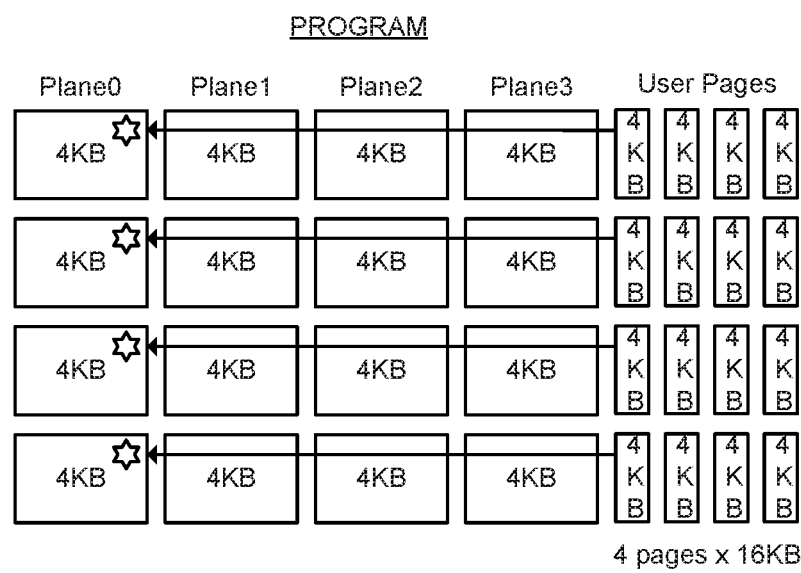

FIG. 4B illustrates an exemplary technique for programming a page of data to memory cells of a memory device. The memory device can include a plurality of planes of memory cells (e.g., Plane0, Plane1, Plane2 and Plane 3), and the memory cells can support QLC. Each plane can include a plurality of inhibit tile groups (ITGs). In this specific example, each plane can include 4 ITGs, and each ITG can have a storage capacity of 4 kilobytes (KB). In one example, the page of data (16 KB) can be allocated by spreading bits of the page of data across multiple ITGs (e.g., 4 ITGs). The page of data can be allocated into one wordline using only one bit of each memory cell (even though memory cells that support QLC can store 4 bits per cell). By allocating the one bit of the page of data to each of the memory cells in the multiple ITGs, the 16 KB page of data can be programmed into the memory cells in the multiple ITGs. In one example, three additional 16 KB page of data can also be programmed into the memory cells in the multiple ITGs using the three remaining bits in each of the memory cells.

As shown in FIGS. 4A and 4B, same bits in different pages of data can be read from the same memory cell and same bits in different pages of data can be stored into the same memory cell, respectively, which can lead to the increased number of ITGs used for reading and programming the page of data from/to the memory cells.

Figure 5A:
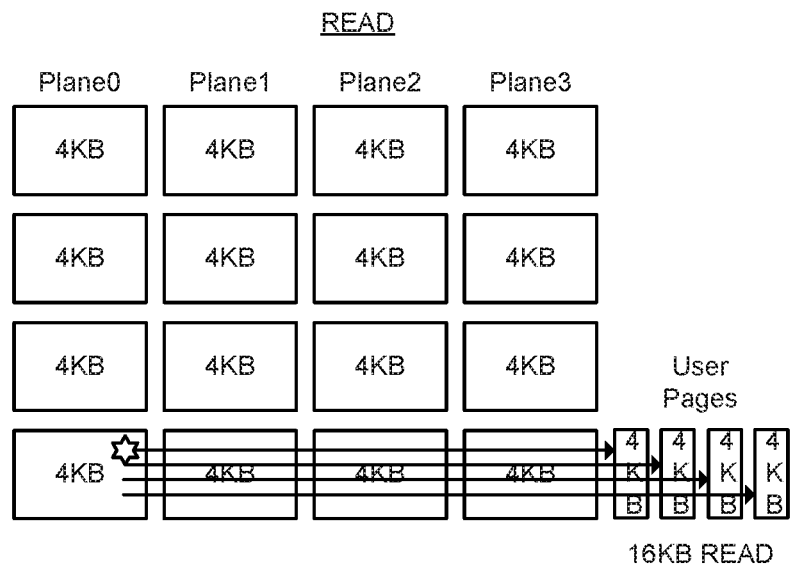
FIGS. 5A and 5B illustrate read and program operations in a memory device in accordance with an example embodiment.

FIG. 5A illustrates an exemplary technique for reading a page of data from memory cells of a memory device. The memory device can include a plurality of planes of memory cells (e.g., Plane0, Plane1, Plane2 and Plane 3), and the memory cells can support QLC. Each plane can include a plurality of inhibit tile groups (ITGs). In this specific example, each plane can include 4 ITGs, and each ITG can have a storage capacity of 4 kilobytes (KB). In one example, the page of data (16 KB) may have been previously allocated by storing bits of the page of data to a single ITG, so the page of data can be read by extracting the bits of the page of data from the single ITG. For example, the page of data may have been previously allocated into one wordline using all four bits of each memory cell, so the page of data can be read by extracting all four bits of the page of data from each of the memory cells in the single ITG. By extracting the 4 bits of the page of data from each of the memory cells in the single ITG, the 16 KB page of data can be read. This scheme can utilize compression by input/output (I/O) to use all of the bits of each memory cell in the single ITG. By storing the page of data in the single ITG (as opposed to multiple ITGs), a reduced number of tiles can be engaged during the read operation, which can deliver improved performance during the read operation.

As a non-limiting example, the memory device can support an 8 KB snap read operation, a 16 KB single ITG (1-ITG) read operation, a 64 KB quad-ITG (4-ITG) read operation, or a 256 KB (16 KB×4×4) ITG read operation.

Figure 5B:
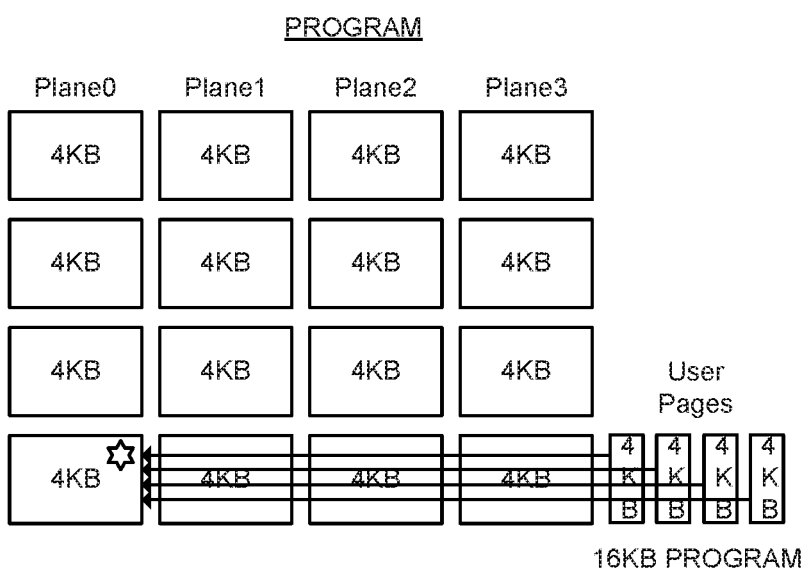

FIG. 5B illustrates an exemplary technique for programming a page of data to memory cells of a memory device. The memory device can include a plurality of planes of memory cells (e.g., Plane0, Plane1, Plane2 and Plane 3), and the memory cells can support QLC. Each plane can include a plurality of inhibit tile groups (ITGs). In this specific example, each plane can include 4 ITGs, and each ITG can have a storage capacity of 4 kilobytes (KB). In one example, the page of data (16 KB) may be allocated by storing bits of the page of data to a single ITG. For example, the page of data may be allocated into one wordline using all four bits of each memory cell in the single ITG. By allocating the 4 bits of the page of data to each of the memory cells in the single ITG, the 16 KB page of data can be programmed. This scheme can utilize compression by input/output (I/O) to use all of the bits of each memory cell in the single ITG. By storing the page of data in the single ITG (as opposed to multiple ITGs), a reduced number of tiles can be engaged during the program operation, which can deliver improved performance during the program operation.

As shown in FIGS. 5A and 5B, a compression by I/O technique can be utilized in which bits of the same page of data can be read from the same memory cell and bits of the same page of data can be stored into the same memory cell, which can lead to the decreased number of ITGs used for reading and programming the page of data from/to the memory cells.

As a non-limiting example, the memory device can support a 16 KB single ITG (1-ITG) program operation, a 64 KB quad-ITG (4-ITG) program operation, or a 256 KB (16 KB×4×4) ITG program operation.

Figure 6:
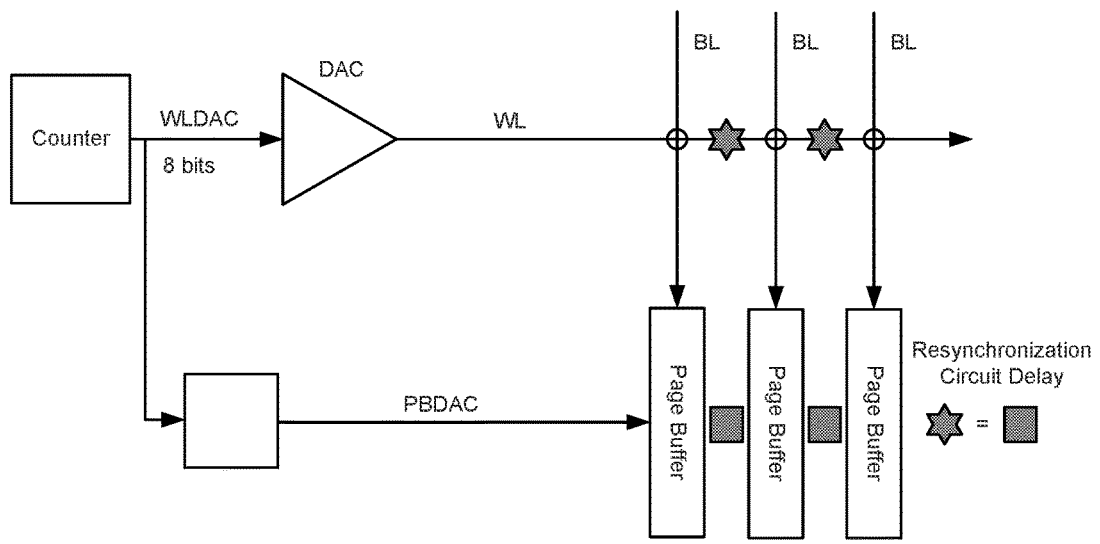
FIG. 6 illustrates a resynchronization circuit in accordance with an example embodiment.

FIG. 6 illustrates an exemplary resynchronization circuit. The resynchronization circuit can include a counter, a wordline digital-to-analog converter (WLDAC), a digital-to-analog converter (DAC), and a page buffer digital-to-analog converter (PBDAC). The DAC can be connected to a wordline (WL). The wordline can intersect with a plurality of bitlines (BL), and each bitline can be connected to a separate page buffer. In one example, there can be a mismatch between the wordline and page buffer voltage threshold (Vth) values (PBDAC), and reducing this mismatch can allow for using a voltage threshold (Vth) window more efficiently. A wordline resynchronization circuit can cause a delay of a ramp along the wordline itself, and this wordline delay can result in a read voltage threshold (Vth) window widening, unless compensation techniques are adopted.

Figure 7:
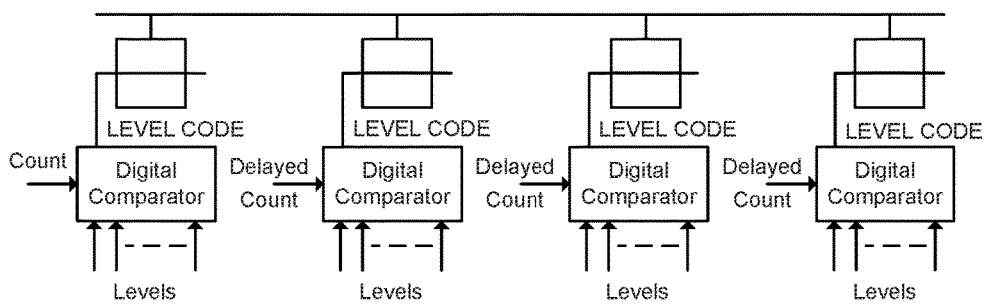
FIG. 7 illustrates a resynchronization circuit with word-line delay compensation in accordance with an example embodiment.

FIG. 7 illustrates an example of a resynchronization circuit with wordline delay compensation. A mismatch between a wordline and page buffer voltage threshold (Vth) values can cause an efficient usage of a voltage threshold (Vth) window more efficiently, and it is desirable to reduce this mismatch. In other words, a wordline resynchronization circuit can cause a delay of a ramp along the wordline itself, and this wordline delay can result in a read voltage threshold (Vth) window widening. To solve this problem, a compensation technique is adopted that uses 4-stage matching. For example, the wordline can be segmented into four slices and four digital comparators can be placed to recalculate the gap, thereby mitigating the widening of the read voltage threshold (Vth) window.

Figure 8:
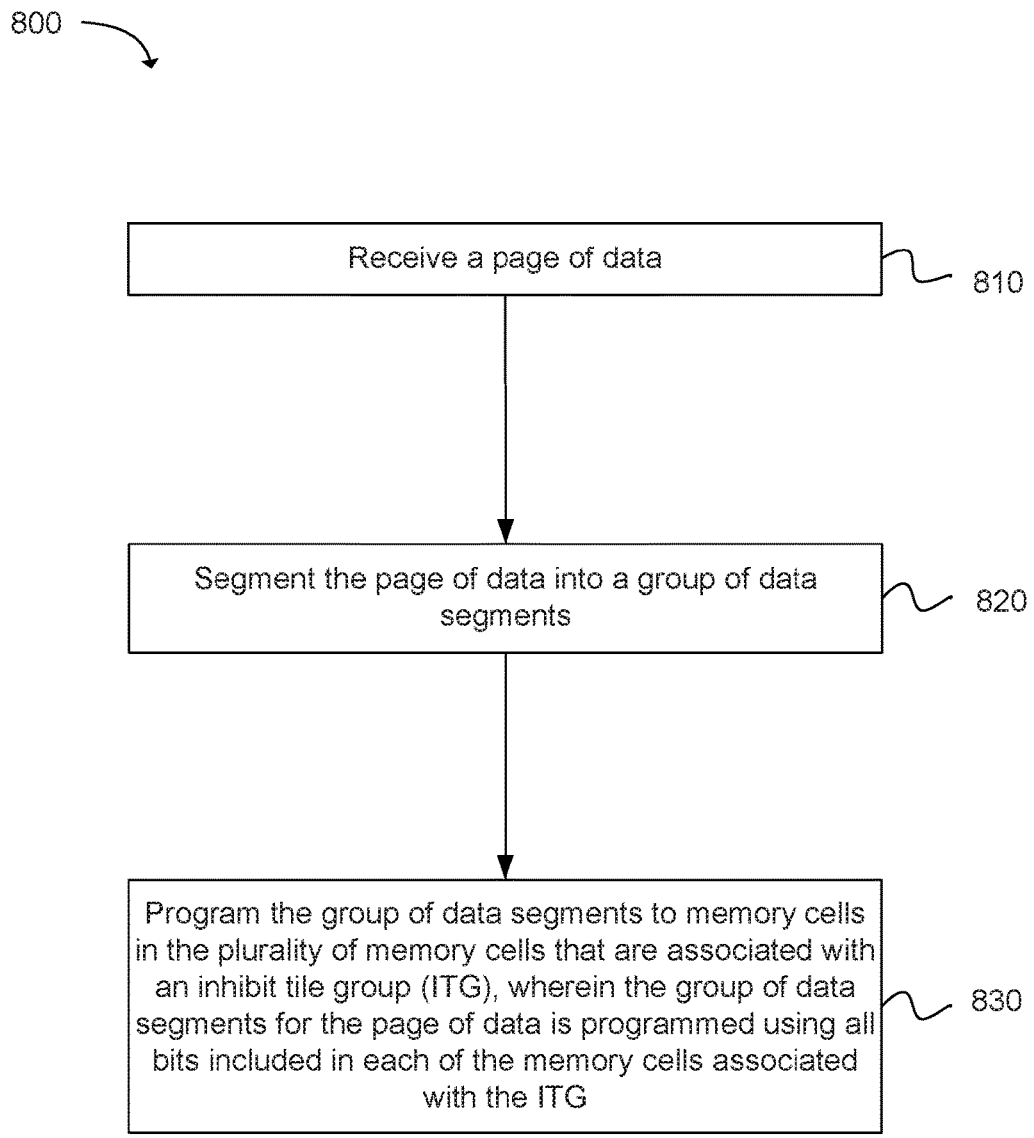
FIG. 8 illustrates operations for programming memory cells in a memory device in accordance with an example embodiment.

FIG. 8 illustrates exemplary operations for programming memory cells in a memory device using a memory controller in the memory device. The memory controller can receive a page of data, as in block 810. The memory controller can segment the page of data into a group of data segments, as in block 820. The memory controller can program the group of data segments to memory cells in the plurality of memory cells that are associated with an inhibit tile group (ITG), as in block 830. The group of data segments for the page of data can be programmed using all bits included in each of the memory cells associated with the ITG.

Figure 9:
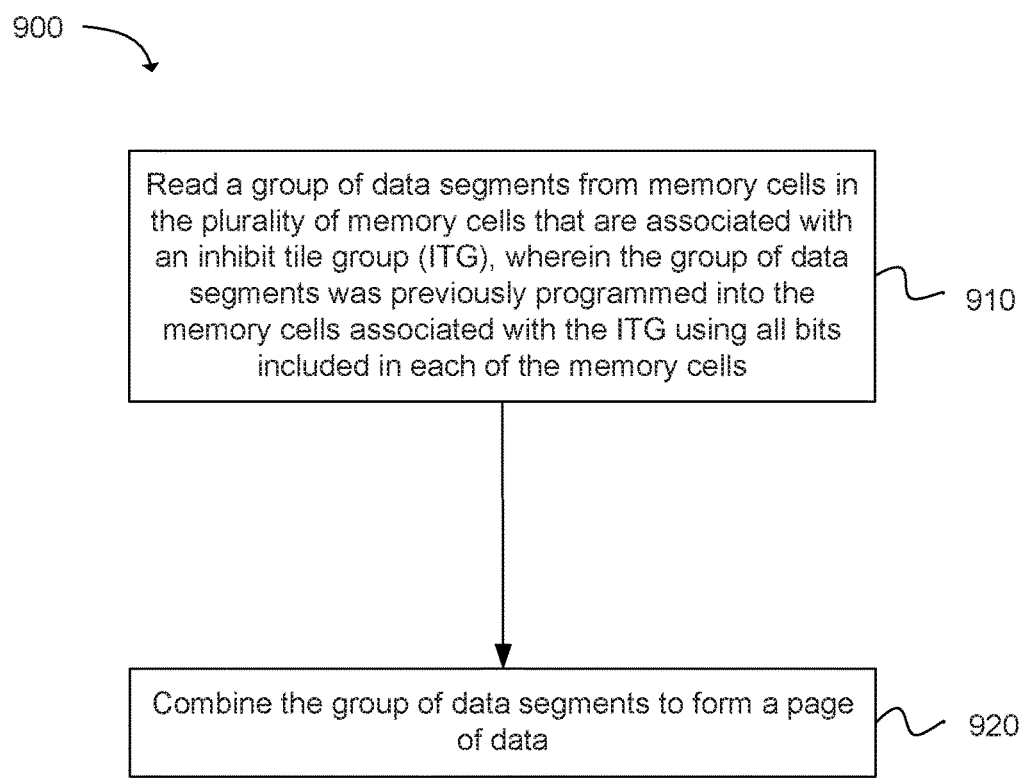
FIG. 9 illustrates operations for reading data from memory cells in a memory device in accordance with an example embodiment.

FIG. 9 illustrates exemplary operations for reading data from memory cells in a memory device using a memory controller in the memory device. The memory controller can read a group of data segments from memory cells in the plurality of memory cells that are associated with an inhibit tile group (ITG), as in block 910. The group of data segments can be previously programmed into the memory cells associated with the ITG using all bits included in each of the memory cells. The memory controller can combine the group of data segments to form a page of data, as in block 920.

Figure 10:
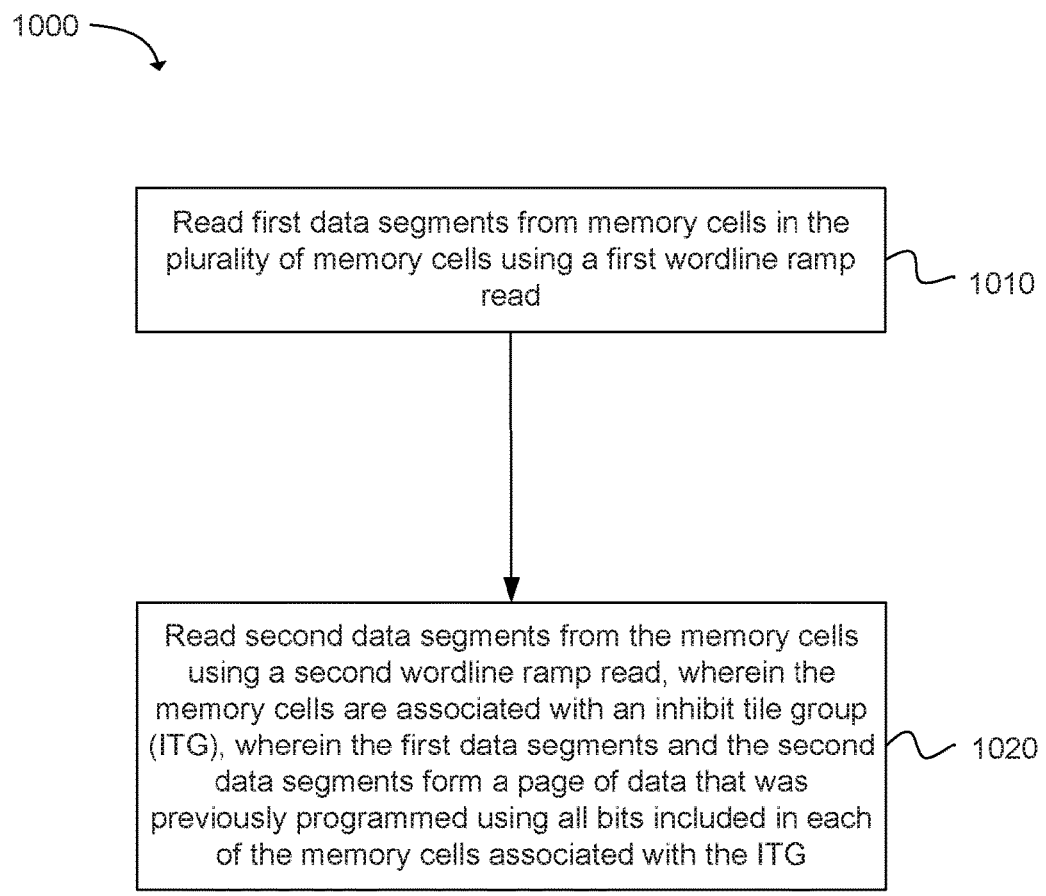
FIG. 10 illustrates operations for reading data from memory cells in a memory device in accordance with an example embodiment.

FIG. 10 illustrates exemplary operations for reading data from memory cells in a memory device using a memory controller in the memory device. The memory controller can read first data segments from memory cells in the plurality of memory cells using a first wordline ramp read, as in block 1010. The memory controller can read second data segments from the memory cells using a second wordline ramp read, as in block 1020. The memory cells can be associated with an inhibit tile group (ITG). The first data segments and the second data segments can form a page of data that was previously programmed using all bits included in each of the memory cells associated with the ITG.

Figure 11:
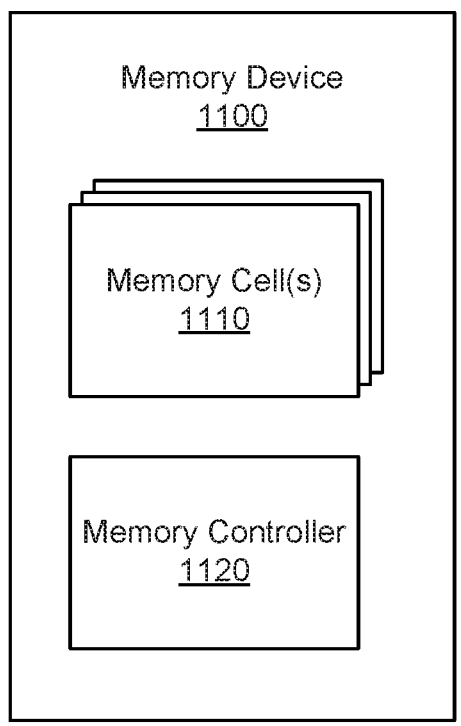
FIG. 11 illustrates a memory device in accordance with an example.

FIG. 11 illustrates an exemplary memory device 1100. The memory device can include a plurality of memory cells 1110 and a memory controller 1120. In one configuration, the memory controller 1120 can receive a page of data; segment the page of data into a group of data segments; and program the group of data segments to memory cells 1110 in the plurality of memory cells 1110 that are associated with an inhibit tile group (ITG), wherein the group of data segments for the page of data is programmed using all bits included in each of the memory cells 1110 associated with the ITG. In another configuration, the memory controller 1120 can read a group of data segments from memory cells 1110 in the plurality of memory cells 1110 that are associated with an inhibit tile group (ITG), wherein the group of data segments was previously programmed into the memory cells 1110 associated with the ITG using all bits included in each of the memory cells 1110; and combine the group of data segments to form a page of data. In yet another configuration, the memory controller 1120 can read first data segments from memory cells 1110 in the plurality of memory cells 1110 using a first wordline ramp read; and read second data segments from the memory cells 1110 using a second wordline ramp read, wherein the memory cells 1110 are associated with an inhibit tile group (ITG), wherein the first data segments and the second data segments form a page of data that was previously programmed using all bits included in each of the memory cells 1110 associated with the ITG.

Figure 12:
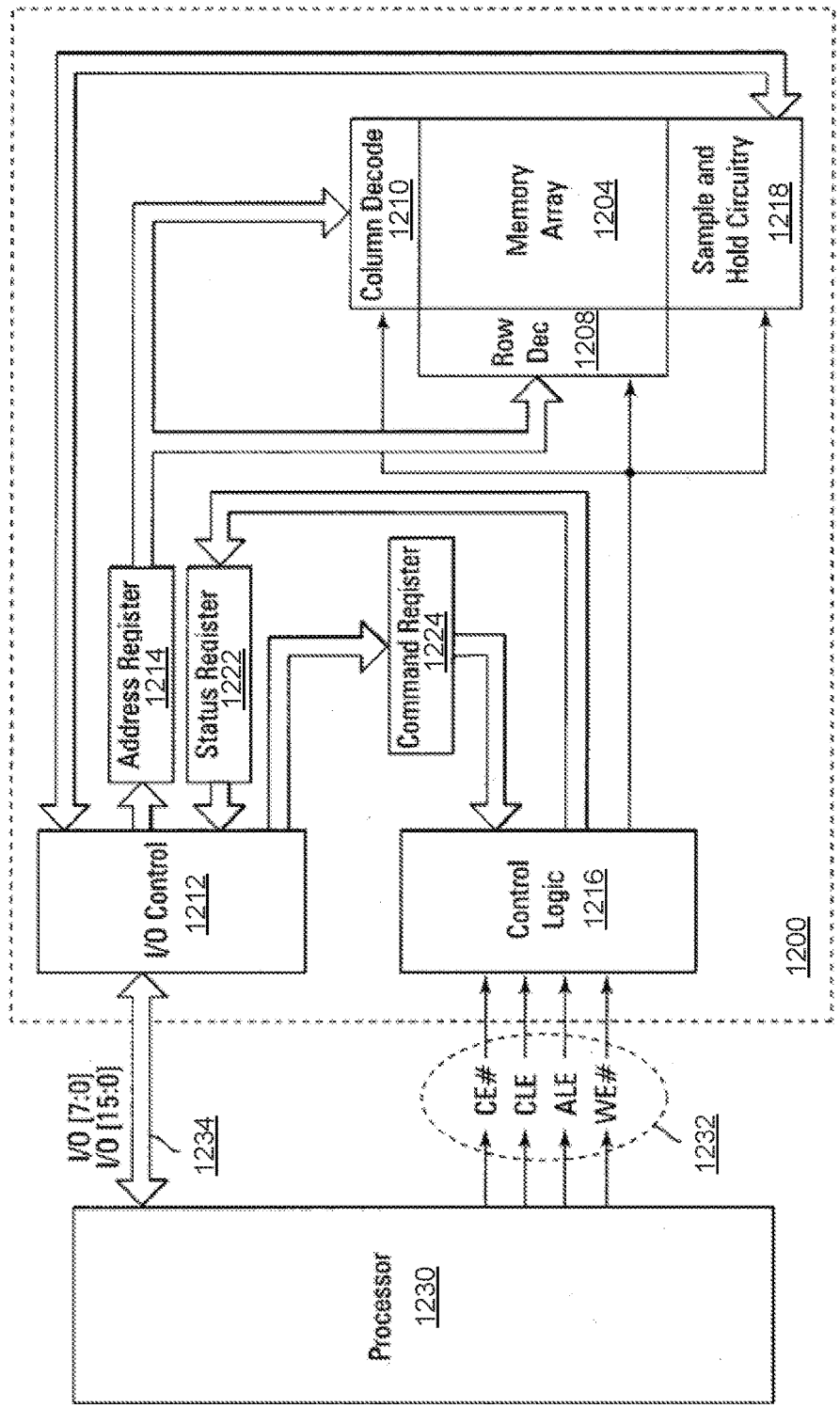
FIG. 12 illustrates a memory system diagram in accordance with an example embodiment.

FIG. 12 is a simplified block diagram of a memory device 1200 according to an invention embodiment, and on which various methods can be practiced. Memory device 1200 includes an array of memory cells 1204 arranged in rows and columns. Although the various embodiments will be described primarily with reference to NAND memory arrays, the various embodiments are not limited to a specific architecture of the memory array 1204. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 1208 and a column decode circuitry 1210 are provided to decode address signals provided to the memory device 1200. Address signals are received and decoded to access memory array 1204. Memory device 1200 also includes input/output (I/O) control circuitry 1212 to manage input of commands, addresses and data to the memory device 1200 as well as output of data and status information from the memory device 1200. An address register 1214 is coupled between I/O control circuitry 1212 and row decode circuitry 1208 and column decode circuitry 1210 to latch the address signals prior to decoding. A command register 1224 is coupled between I/O control circuitry 1212 and control logic 1216 to latch incoming commands. Control logic 1216 controls access to the memory array 1204 in response to the commands and generates status information for an external processor 1230 (also known as a memory controller as described earlier). The control logic 1216 is coupled to row decode circuitry 1208 and column decode circuitry 1210 to control the row decode circuitry 1208 and column decode circuitry 1210 in response to the addresses.

Control logic 1216 can be coupled to a sample and hold circuitry 1218. The sample and hold circuitry 1218 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 1218 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 1212 for output from the memory device, in the case of a read operation, or used for comparison during one or more verify operations in programming the memory device. It is noted that the I/O control circuitry 1212 could optionally include analog-to-digital conversion functionality and digital-to-analog conversion (DAC) functionality to convert read data from an analog data signal to a digital bit pattern and to convert write data from a digital bit pattern to an analog signal such that the memory device 1200 could be adapted for communication with either an analog or digital data interface.

During a programming operation, target memory cells of the memory array 1204 are programmed until voltages indicative of their Vt levels match the levels held in the sample and hold circuitry 1218. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 1218 for transfer to an external processor (not shown in FIG. 12) either directly as analog signals or as digitized representations of the analog signals depending upon whether ADC/DAC functionality is provided external to, or within, the memory device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 1218 can include caching, i.e., multiple storage locations for each data value, such that the memory device 1200 can be reading a next data value while passing a first data value to the external processor, or receiving a next data value while writing a first data value to the memory array 1204. A status register 1222 is coupled between I/O control circuitry 1212 and control logic 1216 to latch the status information for output to the external processor.

Memory device 1200 receives control signals at control logic 1216 over a control link 1232. The control signals can include a chip enable CE#, a command latch enable CLE, an address latch enable ALE, and a write enable WE#. Memory device 1200 can receive commands (in the form of command signals), addresses (in the form of address signals), and data (in the form of data signals) from an external processor over a multiplexed input/output (I/O) bus 1234 and output data to the external processor over I/O bus 1234.

In a specific example, commands are received over input/output (I/O) pins [7:0] of I/O bus 1234 at I/O control circuitry 1212 and are written into command register 1224. The addresses are received over input/output (I/O) pins [7:0] of bus 1234 at I/O control circuitry 1212 and are written into address register 1214. The data can be received over input/output (I/O) pins [7:0] for a device capable of receiving eight parallel signals, or input/output (I/O) pins [15:0] for a device capable of receiving sixteen parallel signals, at I/O control circuitry 1212 and are transferred to sample and hold circuitry 1218. Data also can be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 12 has been simplified to help focus on the embodiments of the disclosure.

While FIG. 12 has been described with respect to sample and hold circuitry 1218, it should be understood that the control logic 1216 could be coupled to data latches instead of sample and hold circuitry 1218 without departing from the scope of the disclosure. Data latches latch data, either incoming or outgoing. During a write operation, target memory cells of the memory array 1204 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 12 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 1234. Because the data signals represent bit patterns instead of individual bits, serial communication of an 8-bit data signal could be as efficient as parallel communication of eight signals representing individual bits.

Figure 13:
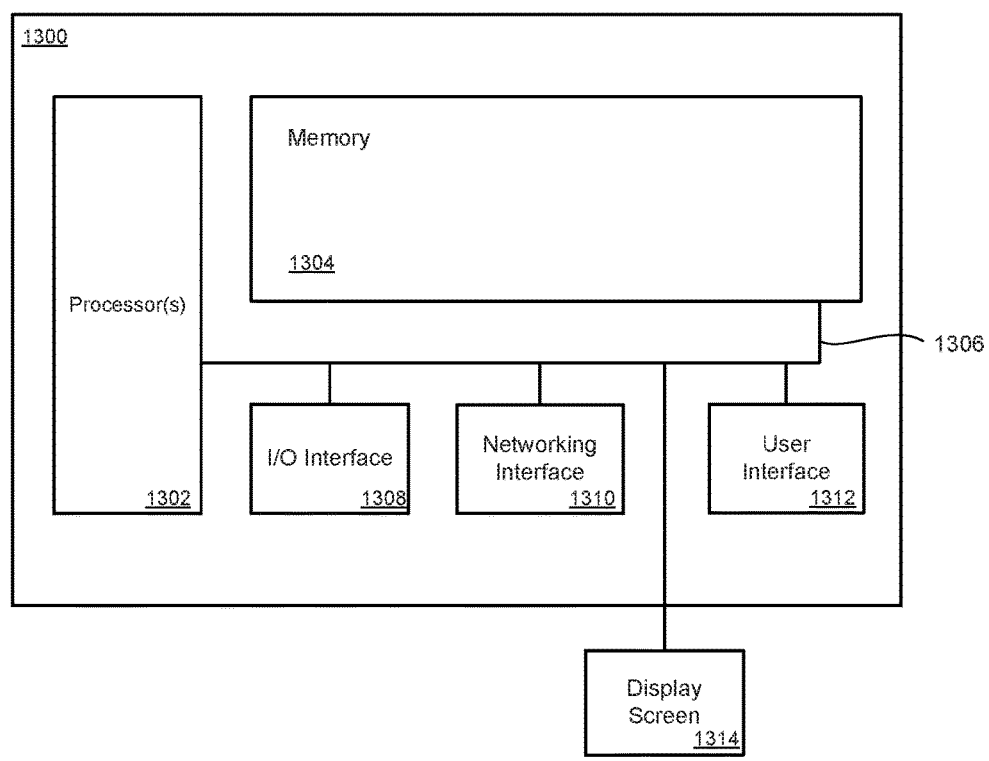
FIG. 13 illustrates a computing system that includes a data storage device in accordance with an example embodiment.

FIG. 13 illustrates a general computing system or device 1300 that can be employed in the present technology. The computing system 1300 can include a processor 1302 in communication with a memory 1304. The memory 1304 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1300 additionally includes a local communication interface 1306 for connectivity between the various components of the system. For example, the local communication interface 1306 can be a local data bus and/or any related address or control busses as may be desired.

The computing system or device 1300 can also include an I/O (input/output) interface 1308 for controlling the I/O functions of the system, as well as for I/O connectivity to devices outside of the computing system 1300. A network interface 1310 can also be included for network connectivity. The network interface 1310 can control network communications both within the system and outside of the system. The network interface can include a wired interface, a wireless interface, a Bluetooth interface, optical interface, and the like, including appropriate combinations thereof. Furthermore, the computing system 1300 can additionally include a user interface 1312, a display device 1314, as well as various other components that would be beneficial for such a system.

The processor 1302 can be a single or multiple processors, and the memory 1304 can be a single or multiple memories. The local communication interface 1306 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided a system operable to program memory cells. The system can comprise a plurality of memory cells and a memory controller. The memory controller can comprise logic to receive a page of data. The memory controller can comprise logic to segment the page of data into a group of data segments. The memory controller can comprise logic to program the group of data segments to memory cells in the plurality of memory cells that are associated with an inhibit tile group (ITG), wherein the group of data segments for the page of data is programmed using all bits included in each of the memory cells associated with the ITG.

In one example of the system, the memory controller is configured to allocate the page of data into one wordline using all bits included in each of the memory cells associated with the ITG, such that bits on a same page of data are stored into same memory cells.

In one example of the system, the memory cells do not include data segments from different pages of data.

In one example of the system, the memory controller is configured to program the page of data into the memory cells associated with the ITG using a compression by input-output (IO) in which bits of a same page of data are stored into a same memory cell.

In one example of the system, the memory controller is configured to program the page of data into the memory cells using the ITG and using all bits included in each of the memory cells associated with the ITG to reduce a block size.

In one example of the system, the memory controller is configured to program the page of data into the memory cells using the ITG and using all bits included in each of the memory cells associated with the ITG to reduce a number of tiles utilized during a program operation.

In one example of the system, the ITG supports 4 kilobytes (KB) of data and the page of data is 16 KB and each data segment is 4 KB, wherein the page of data is programmed to the memory cells associated with the ITG using a compression by input-output (IO).

In one example of the system, the memory controller is configured to receive the page of data from a processor communicatively coupled to the memory controller.

In one example of the system, the ITG is a single ITG.

In one example of the system, the plurality of memory cells includes a plurality of quad-level cells (QLCs) that each support 4 bits of data.

In one example of the system, the system is a NAND flash device.

In one example, there is provided a memory device operable to read data from memory cells in the memory device. The memory device can comprise a plurality of memory cells and a memory controller. The memory controller can comprise logic to read a group of data segments from memory cells in the plurality of memory cells that are associated with an inhibit tile group (ITG), wherein the group of data segments was previously programmed into the memory cells associated with the ITG using all bits included in each of the memory cells. The memory controller can comprise logic to combine the group of data segments to form a page of data.

In one example of the memory device, the group of data segments is allocated into one wordline using all bits included in each of the memory cells associated with the ITG, such that bits on a same page of data are stored into same memory cells, and the memory cells do not include data segments from different pages of data.

In one example of the memory device, the group of data segments was previously programmed into the memory cells using the ITG and using all bits included in each of the memory cells associated with the ITG to reduce a block size.

In one example of the memory device, the group of data segments was previously programmed into the memory cells using the ITG and using all bits included in each of the memory cells associated with the ITG to reduce a number of tiles utilized during a subsequent read operation.

In one example of the memory device, the group of data segments was previously programmed into the memory cells associated with the ITG using a compression by input-output (IO) in which bits of a same page of data was programmed into a same memory cell.

In one example of the memory device, the memory controller is configured to provide the page of data to a processor communicatively coupled to the memory device.

In one example of the memory device, the plurality of memory cells includes a plurality of quad-level cells (QLCs) that each support 4 bits of data.

In one example of the memory device, the memory device is a NAND flash device.

In one example, there is provided a memory device operable to read data from memory cells in the memory device. The memory device can comprise a plurality of memory cells and a memory controller. The memory controller can comprise logic to read first data segments from memory cells in the plurality of memory cells using a first wordline ramp read. The memory controller can comprise logic to read second data segments from the memory cells using a second wordline ramp read, wherein the memory cells are associated with an inhibit tile group (ITG), wherein the first data segments and the second data segments form a page of data that was previously programmed using all bits included in each of the memory cells associated with the ITG.

In one example of the memory device, the first wordline ramp read utilizes shielded bitline odd sensing for reading the first data segments and the second wordline ramp read utilizes shielded bitline even sensing for reading the second data segments.

In one example of the memory device, the first wordline ramp read utilizes shielded bitline even sensing for reading the first data segments and the second wordline ramp read utilizes shielded bitline odd sensing for reading the second data segments.

In one example of the memory device, the page of data is allocated into one wordline using all bits included in each of the memory cells associated with the ITG, such that bits on a same page of data are stored into same memory cells, and the memory cells do not include data segments from different pages of data.

In one example of the memory device, the page of data was previously programmed into the memory cells using the ITG and using all bits included in each of the memory cells associated with the ITG to reduce a block size.

In one example of the memory device, the page of data was previously programmed into the memory cells using the ITG and using all bits included in each of the memory cells associated with the ITG to reduce a number of tiles utilized during a subsequent read operation.

In one example of the memory device, the page of data was previously programmed into the memory cells associated with the ITG using a compression by input-output (TO) in which bits of a same page of data was programmed into a same memory cell.

In one example of the memory device, the plurality of memory cells includes a plurality of quad-level cells (QLCs) that each support 4 bits of data.

In one example of the memory device, the memory device is a NAND flash device.

In one example there is provided a method for programming memory cells in a memory device. The method can include receiving, at a memory controller of the memory device, a page of data. The method can include segmenting, at the memory controller, the page of data into a group of data segments. The method can include programming, at the memory controller, the group of data segments to memory cells in a plurality of memory cells in the memory device that are associated with an inhibit tile group (ITG), wherein the group of data segments for the page of data is programmed using all bits included in each of the memory cells associated with the ITG.

In one example of the method for programming memory cells in the memory device, the method can include allocating the page of data into one wordline using all bits included in each of the memory cells associated with the ITG, such that bits on a same page of data are stored into same memory cells.

In one example of the method for programming memory cells in the memory device, the memory cells do not include data segments from different pages of data.

In one example of the method for programming memory cells in the memory device, the method can include programming the page of data into the memory cells associated with the ITG using a compression by input-output (TO) in which bits of a same page of data are stored into a same memory cell.

In one example of the method for programming memory cells in the memory device, the method can include programming the page of data into the memory cells using the ITG and using all bits included in each of the memory cells associated with the ITG to reduce a block size.

In one example of the method for programming memory cells in the memory device, the method can include programming the page of data into the memory cells using the ITG and using all bits included in each of the memory cells associated with the ITG to reduce a number of tiles utilized during a program operation.

In one example of the method for programming memory cells in the memory device, the ITG supports 4 kilobytes (KB) of data and the page of data is 16 KB and each data segment is 4 KB, wherein the page of data is programmed to the memory cells associated with the ITG using a compression by input-output (IO).

In one example of the method for programming memory cells in the memory device, the method can include receiving the page of data from a processor communicatively coupled to the memory controller.

In one example of the method for programming memory cells in the memory device, the ITG is a single ITG.

In one example of the method for programming memory cells in the memory device, the plurality of memory cells includes a plurality of quad-level cells (QLCs) that each support 4 bits of data.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A system operable to program memory cells, the system comprising:
    a plurality of memory cells; and
    a memory controller comprising logic to:
        receive a page of data;
        segment the page of data into a group of data segments; and
        program the group of data segments to memory cells in the plurality of memory cells that are associated with a memory cell region, wherein the group of data segments for the page of data is programmed using all bits included in each of the memory cells associated with the memory cell region, wherein the page of data is allocated into one wordline using all bits included in each of the memory cells associated with the memory cell region.

2. The system of claim 1, wherein the memory controller is configured to program the page of data into the memory cells associated with the memory cell region using a compression by input-output (IO) in which bits of the same page of data are stored into the same memory cell.

3. The system of claim 1, wherein the memory controller is configured to program the page of data into the memory cells using the memory cell region and using all bits included in each of the memory cells associated with the memory cell region to reduce a block size.

4. The system of claim 1, wherein the memory controller is configured to program the page of data into the memory cells using the memory cell region and using all bits included in each of the memory cells associated with the memory cell region to reduce number of tiles utilized during a program operation.

5. The system of claim 1, wherein the memory cell region supports a storage capacity of 4 kilobytes (KB) of data and the page of data is 16 KG and each data segment is 4 KG, wherein the page of data is programmed to the memory cells associated with the memory cell region using a compression by input-output (IO).

6. The system of claim 1, wherein the memory controller is configured to receive the page of data from a processor communicatively coupled to the memory controller.

7. The system of claim 1, wherein the plurality of memory cells includes a plurality of quad-level cells (QLCs) that each support 4 bits of data.

8. The system of claim 1, wherein the system is a NAND flash device.

9. The system of claim 1, wherein the memory cell region is included in a plane of memory cells.

10. The system of claim 9, wherein the plane of memory cells includes four memory cell regions.

11. A memory device operable to read data from memory cells in the memory device, the memory device comprising:
    a plurality of memory cells; and
    a memory controller comprising logic to:
        read a group of data segments from memory cells in the plurality of memory cells that are associated with a memory cell region, wherein the group of data segments was previously programmed into the memory cells associated with the memory cell region using all bits included in each of the memory cells; and
        combine the group of data segments to form a page of data,
    wherein the group of data segments is allocated into one wordline using all bits included in each of the memory cells associated with the memory cell region.

12. The memory device of claim 11, wherein the group of data segments was previously programmed into the memory cells using the memory cell region and using all bits included in each of the memory cells associated with the memory cell region to reduce a block size.

13. The memory device of claim 11, wherein the group of data segments was previously programmed into the memory cells using the memory cell region and using all bits included in each of the memory cells associated with the memory cell region to reduce a number of tiles utilized during a subsequent read operation.

14. The memory device of claim 11, wherein the group of data segments was previously programmed into the memory cells associated with the memory cell region using a compression by input-output (IO) in which bits of the same page of data was programmed into the same memory cell.

15. The memory device of claim 11, wherein the memory controller is configured to provide the page of data to a processor communicatively coupled to the memory device.

16. The memory device of claim 11, wherein the plurality of memory cells includes a plurality of quad-level cells (QLCs) that each support 4 bits of data.

17. The memory device of claim 11, wherein the memory device is a NAND flash device.

18. The memory device of claim 11, wherein the memory cell region is included in a plane of memory cells.

19. The memory device of claim 18, wherein the plane of memory cells includes four memory cell regions.

20. A method for programming memory cells in a memory device, the method comprising:

receiving, at a memory controller of the memory device, a page of data;

segmenting, at the memory controller, the page of data into a group of data segments;

programming, at the memory controller, the group of data segments to memory cells in a plurality of memory cells in the memory device that are associated with a memory cell region, wherein the group of data segments for the page of data is programmed using all bits included in each of the memory cells associated with the memory cell region; and allocating the page of data into one wordline using all bits included in each of the memory cells associated with the memory cell region.

21. The method of claim 20, further comprising programming the page of data into the memory cells associated with the memory cell region using a compression by input-output (IO) in which bits of the same page of data are stored into the same memory cell.

22. The method of claim 20, further comprising programming the page of data into the memory cells using the memory cell region and using all bits included in each of the memory cells associated with the memory cell region to reduce a block size.

23. The method of claim 20, further comprising programming the page of data into the memory cells using the memory cell region and using all bits included in each of the memory cells associated with the memory cell region to reduce a number of tiles utilized during a program operation.

24. The method of claim 20, wherein the memory cell region supports a storage capacity of 4 kilobytes (KB) of data and the page of data is 16 KB and each data segment is 4 KB, wherein the page of data is programmed to the memory cells associated with the memory cell region using a compression by input-output (IO).

25. The method of claim 19, further comprising receiving the page of data from a processor communicatively coupled to the memory controller.

26. The method of claim 20, wherein the plurality of memory cells includes a plurality of quad-level cells (QLCs) that each support 4 bits of data.

27. The method of claim 20, wherein the memory cell region is included in a plane of memory cells.

28. The method of claim 27, wherein the plane of memory cells includes four memory cell regions.

\* \* \* \* \*